United States Patent [19]
Yao

[11] Patent Number: 5,716,890
[45] Date of Patent: Feb. 10, 1998

[54] STRUCTURE AND METHOD FOR FABRICATING AN INTERLAYER INSULATING FILM

[75] Inventor: Liang-Gi Yao, Taipei, Taiwan

[73] Assignee: Vanguard International Semiconductor Corporation, Hsin-chu, Taiwan

[21] Appl. No.: 734,060

[22] Filed: Oct. 18, 1996

[51] Int. Cl.⁶ .................................................. H01L 21/316
[52] U.S. Cl. .................. 438/624; 438/633; 438/784; 438/699; 257/634; 257/644
[58] Field of Search ............................... 437/240, 982, 437/236, 238, 195, 235; 257/634, 644; 438/624, 631, 633, 784, 783, 699

[56] References Cited

U.S. PATENT DOCUMENTS

| 5,004,704 | 4/1991 | Maeda et al. | 437/240 |
| 5,188,987 | 2/1993 | Ogino | 437/235 |
| 5,376,591 | 12/1994 | Maeda et al. | 437/240 |
| 5,444,026 | 8/1995 | Kim et al. | 437/240 |
| 5,554,565 | 9/1996 | Liaw et al. | 437/982 |

FOREIGN PATENT DOCUMENTS

| 0055538 | 4/1980 | Japan | 437/240 |
| 56-108235 | 8/1981 | Japan | . |
| 0095556 | 5/1986 | Japan | 437/982 |
| 0192239 | 8/1988 | Japan | 437/240 |
| 0076727 | 3/1989 | Japan | 437/982 |
| 0294053 | 12/1990 | Japan | 437/982 |
| 5-275424 | 10/1993 | Japan | . |

OTHER PUBLICATIONS

S.M. Sze, "VLSI Technology" McGraw Hill International Edition, McGraw Hill Book Co. Singapore, 1988, pp. 308–315.

P. Singer, "Trends in Liquid Sources" in Semiconductor International, Jun. 1993, pp. 92–96.

D. Pramanik, "Integrated Dielectric Into Sub-Half Micron Multilevel Metallization Circuits", Solid State Technology, Sep. 1995, pp. 59–78.

*Primary Examiner*—Charles L. Bowers, Jr.
*Assistant Examiner*—Matthew Whipple
*Attorney, Agent, or Firm*—George O. Saile; Stephen B. Ackerman; William J. Stoffel

[57] ABSTRACT

The present invention provides a structure and method of manufacturing an interlevel/intermetal dielectric layer for a semiconductor device. The method begins by forming a stepped pattern 16 on a semiconductor structure 12. A barrier layer 20 composed of silicon oxide is formed on the semiconductor substrate so as to cover the surface of the stepped pattern 16. A first insulating layer 22 composed of silicon oxide is then formed over the barrier layer 20. A high P (phosphorous) content silicon glass layer 24 preferably is formed over the first insulating layer 22. The high P content silicon glass layer 24 has a phosphorous concentration in a range of about 4 and 10 weight percent. Next, in an important step, a graded P content silicon glass layer 26 is formed over the high P content silicon glass layer 24. The graded P content silicon glass layer 26 has a phosphorous concentration in a range of about 0.1 and 4 weight percent. A capping layer 28 composed of first silicon oxide is formed over the graded P content silicon glass layer 26. The capping layer can be treated with an optional $N_2$ or Ar plasma treatment. The capping layer 28 is then planarized using a chemical mechanically polishing process thereby removing a portion of the capping layer 28.

37 Claims, 3 Drawing Sheets

STRUCTURE AND METHOD FOR FABRICATING AN INTERLAYER INSULATING FILM

BACKGROUND OF THE INVENTION

1. Field of the Invention

This invention relates generally to the fabrication of insulating layers for semiconductor devices and more particularly to a method for forming an insulating layer between conductive patterns in a semiconductor device.

2. Description of the Prior Art

Multiple levels of metallization have become very common as semiconductor devices become more complex. Insulating and dielectric layers are an important part of a multilevel metal system by providing insulation between the various levels of metallization and as a final passivation layer that provides protection to the circuit. Contrary to being a passive element in the multilevel metallization system, dielectric films perform an active role in defining the reliability and performance of the integrated circuit.

As device geometry and operating voltages continue to scale down and functional density increase in semiconductor devices, it is important to reduce RC (resistance/capacitance) delay and maintain adequate crosstalk signal-to-noise margins. Providing improved performance though the reduction in capacitance, especially lateral line capacitance, is particularly effective.

In conventional processes, the space between conductive lines is filled with a solid dielectric layer. The dielectric layer can be formed of many materials including, silicon oxide. These layers can be formed by many different processes, such as silicon oxide which can be formed by conventional thermal processes. While effective, these layers have capacitance which contribute to device delay. In addition, it is important for the dielectric layers to have a low stress to avoid peeling and to minimize other reliability problems.

Chemical-mechanical polishing (CMP) is becoming a common technique to planarize dielectric layers. In chemical-mechanical polishing, a slurry is used to grind down dielectric layer to form a flat level surface. However, many current dielectric layers, such as doped silicon oxide layers, absorb water from the CMP slurry.

In addition, it is important for the dielectric layers to be able to getter alkaline ions, such as Na+ ions, and other ions to protect the sensitive devices from leakage currents and other problems. All slurries used in CMP processes contain certain amounts of alkaline ions.

Moreover, when spin-on-glass is used, poison via problem exist when the spin on glass is exposed to the metal connections in the vias. Often the poison via is caused by an incomplete etchback of a spin-on-glass layer over a metal line in a via hole.

Therefore, there is a need for an improved structure and process for forming a dielectric layer between closely spaced metallurgy lines that reduces capacitance. This process must be easy to manufacture, form voidless fill in narrow trenches between metal conductors, provide a planar surface, reduce stress between different layers, have good moisture resistance, have a low dielectric constant, have good ion gettering properties, be compatible with chemical-mechanical polish processes and not impact the reliability of the semiconductor devices.

Sez. in VLIS Technology, 2nd Ed. 1988, pub by McGraw Hill book Company Singapore, pp. 308–315 teaches diffusion of Phosphorous in polysilicon and silicon oxide. TRENDS IN LIQUID SOURCES by Peter Singer Published in SEMICONDUCTOR INTERNATIONAL, Jun. 1993, pp. 92–96 and INTEGRATED DIELECTRIC INTO SUB-HALF-MICRON MULTILEVEL METALLIZATION CIRCUITS by D. Pramanik, published in Solid State Technology, Sep. 1995, pp. 59–78, describe methods for multilayer metallurgy/dielectric manufacture. However, these methods can be further improved to provide a better interdielectric layer process.

SUMMARY OF THE INVENTION

It is an object of the present invention to provide an improved structure and process for forming a dielectric layer between closely spaced metallurgy lines (e.g., gates or metal lines) that reduces stress and capacitance.

It is an object of the present invention to provide an improved structure and process for forming an interlevel/intermetal dielectric layer that can fill narrow trenches between conductors, provide a planar surface, have low stress, that have good moisture resistance.

It is an object of the present invention to provide an improved structure and process for forming an interlevel/intermetal dielectric layer that has superior ion gettering properties, is compatible with chemical-mechanical polish processes and improves the reliability of the semiconductor devices.

It is an object of the present invention to provide an improved structure and process for forming an interlevel/intermetal dielectric layer that has a grade P (phosphorous) content layer over a high P content layer.

To accomplish the above objectives, the present invention provides a method of manufacturing an interlevel/intermetal dielectric layer for a semiconductor device. A key feature of the invention is a graded P (phosphorous) layer that is formed over a high P content layer. The invention has two major embodiments. The first embodiment is an intermetal dielectric layer 22 24 26 which includes a first insulating layer 22 (FIG. 3). The dielectric layer of the first embodiment is preferably formed over metal lines over the substrate surface. The second embodiment is an interlevel dielectric layer 24 26 (without a first insulting layer 22) which is preferably formed over conductive patterns on the substrate surface, such a gate electrodes.

The method for the first embodiment begins by (FIG. 3) forming a stepped pattern 16 on a semiconductor structure 12. The stepped pattern has gaps therebetween. A barrier layer 20 composed of silicon oxide is formed on the semiconductor substrate so as to cover the surface of the stepped pattern 16. A first insulating layer 22 composed of silicon oxide is then formed preferably by ozone—TEOS over the barrier layer 20. A high P (phosphorous) content silicon glass layer 24 preferably is formed over the first insulating layer 22. The high P content silicon glass layer 24 has a phosphorous concentration in a range between about 4 and 10 weight percent.

Next, in an important step, a graded P content silicon glass layer 26 is formed over the first high P content silicon glass layer 24. The graded P content silicon glass layer 26 preferably has a phosphorous concentration in a range of about 0.1 and 4 weight percent. The graded P content silicon glass layer 26 has a high P concentration on the low region near the High P layer 24 and the P concentration decreases to almost zero in the highest portion near the top cap layer 28. A capping layer 28 composed of first silicon oxide is preferably made by an Ozone—TEOS or PECVD process, is formed over the graded P content silicon glass layer 26.

The capping layer can be treated with an optional $N_2$ or Ar plasma treatment. The capping layer 28 is then planarized using a chemical mechanically polishing process thereby removing a portion of the capping layer 28.

The present invention provides intermetal/inter dielectric layers which form voidless fill of narrow trenches between metal conductors, provides a planar surface, reduces stress between different layers, have good moisture resistance, have low dielectric constant, have superior ion gettering properties, are compatible with chemical-mechanical polish processes and improve the reliability of the semiconductor devices.

An important feature of the invention for both embodiments is the graded P (phosphorous) layer 26 which reduces the stress between the high P layer 24 and the capping layer 28. In addition, the graded P layer 26 provides a more CMP (chemical-mechanical polish) compatible process by acting as a moisture barrier which repels moisture from the CMP slurry. The graded P layer forms a good moisture barrier which prevents the moisture from the CMP slurry from diffusing to the high P layer 24 which will readily absorb the moisture. This lower overall moisture content of the dielectric layer increases reliability.

BRIEF DESCRIPTION OF THE DRAWINGS

The features and advantages of a semiconductor device according to the present invention and further details of a process of fabricating such a semiconductor device in accordance with the present invention will be more clearly understood from the following description taken in conjunction with the accompanying drawings in which like reference numerals designate similar or corresponding elements, regions and portions and in which.

DETAILED DESCRIPTION OF THE PREFERRED EMBODIMENTS

The present invention will be described in detail with reference to the accompanying drawings. The present invention provides a method of manufacturing an interlevel/intermetal dielectric layer for a semiconductor device.

Figure 3:
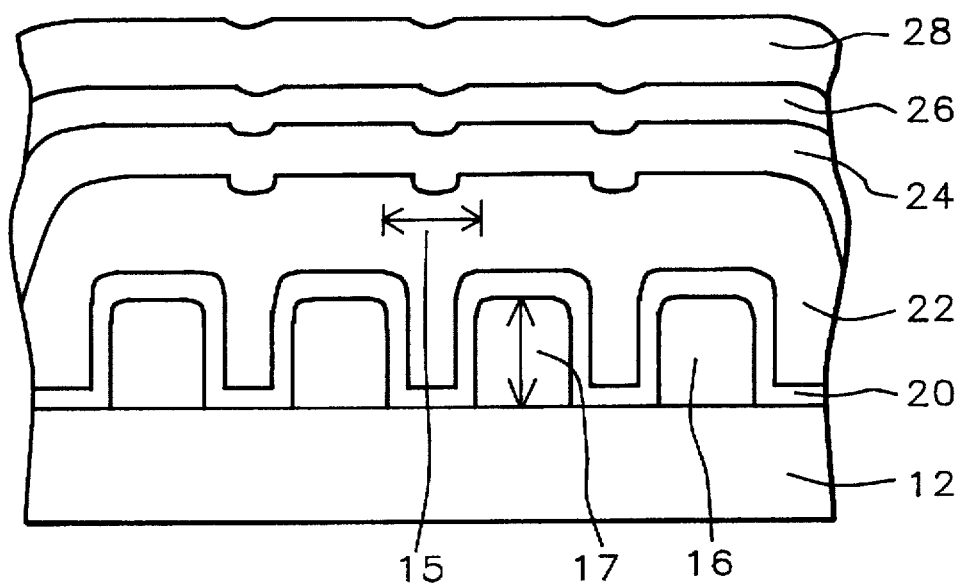
FIGS. 3 and 4 are cross sectional views for illustrating a first embodiment of the method for manufacturing an interlevel/intermetal dielectric layer according to the present invention.

The invention has two major embodiments. The first embodiment is an intermetal dielectric layer 22 24 26 which includes a first insulating layer 22 (FIG. 3). The dielectric layer of the first embodiment is preferably formed over metal lines above the substrate surface. The second embodiment is an interlevel dielectric layer 24 26 (which does not include a first insulating layer) which is preferably formed over conductive patterns on the substrate surface, such a gate electrodes.

The term "interlevel dielectric" layers refers to dielectric layers formed over conductive pattern on the substrate surface, such as gate electrodes, etc. The term "inter metal dielectric" layer refers to dielectric layers formed over conductive lines formed over usually metal line that are above the substrate surface and do not directly lie on the substrate. It is important to note that the dielectric layer of the present invention can be used in any dielectric layer application including both as an inter metal dielectric or an interlevel dielectric layer. That is, for example, the dielectric layer of the present invention can be formed over gate electrodes on the substrate surface and over conductive lines over the substrate surface. For example, the conductive patterns 16 in FIGS. 1–4 can represent conductive patterns on a substrate or metal lines above the substrate.

The first embodiment for forming the intermetal layer 22 24 26 of a semiconductor devices begins by providing a semiconductor structure as shown in FIG. 3. Semiconductor structure 12 is understood to include a semiconductor wafer, any active and passive devices formed within the wafer and layers formed on the wafer surface. The term "structure" is mean to include devices formed within a semiconductor wafer and the layers overlying the wafer. The term "structure surface" is meant to include the upper most exposed layers on a semiconductor wafer, such as a silicon surface, an insulating layer and metallurgy lines.

Still referring to FIG. 3, a stepped pattern 16 is formed on the semiconductor structure 12. The stepped pattern has gaps therebetween. The stepped pattern can represent conductive patterns formed directly on the substrate, such as gate electrodes and can represent metal lines formed over the substrate. The metal lines 16 preferably have a height 17 in a range of about 5000 and 10,000 Å and a spacing/gap 15 in a range of about 0.3 and 0.8 μm.

A barrier layer 20 (nucleation layer) is formed on the semiconductor substrate so as to cover the surface of the stepped pattern 16. The barrier layer can be formed of silicon oxide, silicon nitride, and oxynitride, and is more preferably formed of silicon oxide. The barrier layer composed of silicon oxide is preferably formed by (1) PE-silane process, (2) PE-TEOS process or (3) low O3 TEOS process. The barrier layer (nucleation layer) acts as a nucleation layer for an overlying first insulating layer 22. See below.

The PE-TEOS silicon oxide is preferably treated with a (optional) $N_2$ or Ar plasma treatment which comprises plasma etching the PE-TEOS layer with positive ions, at an energy in a range of about 300 and 700 watts at a frequency of between about 13.50 and 13.60 MHz (tgt=13.65 MHz), or at a n energy in a range of about 30 and 400 watts at a frequency of between about 300 and 400 KHz (tgt=3.50 KHz), for a time in a range of about 30 and 150 seconds.

The barrier layer formed of these three process ((1) PE-silane process, (2) PE-TEOS process or (3) low O3 TEOS process) can be treated with the plasma treatment (see above) of the present invention. However, the barrier layer formed by a PE-TEOS process benefits most from the plasma treatment. Films deposited by PE-silane and low $O_3$-TEOS process have reduced surface sensitivity to the formation process (ozone TEOS process) of the subsequent first insulating layer 22.

A first insulating layer 22 is then formed over the barrier layer 20. The first insulating layer 22 is preferably composed of silicon oxide, formed by an ozone TEOS silicon oxide, HDP (high density plasma silicon oxide or chemical vapor deposition (CVD) oxide process. The first insulating layer 22 is more preferably formed of silicon oxide formed by an ozone TEOS process. This ozone TEOS oxide layer can be deposited using a chemical vapor deposition reactor which flows ozone at flow rates of between about 3500 and 6000 sccm and helium flows at between about 3500 and 5500 sccm under a pressure of between about 400 and 600 torr, Tetraethylorthosilicate (TEOS) at a rate of 200 and 4000 mg/min, spacing of between about 200 and 300 mils, and wafer temperature of between about 360° C. and 440° C.

Alternately the first insulating layer 22 can be deposited using a TEOS process which flows Tetraethylorthosilicate (TEOS) at between about 5 to 20 SLM, ozone at concentration of between about 90 and 150 g/m$^3$, $O_2$ (oxygen) flow rates between about 30 and 50 SLM (standard liters per minute), and nitrogen flows at between about 70 and 110 SLM under a pressure of between about 400 and 600 torr, and deposition temperature of between about 360 ° C. and 440 ° C.

Still referring to FIG. 3, a high P (phosphorous) content silicon glass layer 24 is formed over the first insulating layer 22. The high P content silicon glass layer 24 preferably has a phosphorous concentration in a range of about 4 and 10 weight percent and a thickness in a range of between about 3000 and 7000 Å.

The High P silicon glass layer (i.e., hi content PSG layer) can be formed using an ozone—TEOS process by the reaction of TEOS—$O_3$ and triethylphosphate (TEPO) (an example of a phosphorous source) and with He as a carrier gas at a temperature in a range of about 400° and 600° C. The PSG layer can also be formed in a LPCVD process by $SiH_4$ and $PH_3$. The most preferred method of forming the PSG layer is shown in the table 1 below:

TABLE 1

| Process variables for the High P layer 24 | | |
|---|---|---|
| Reactant/parameter | low Rate | high rate |
| TEOS Mg/min | 400 | 600 |
| He(sccm) | 4000 | 6500 |
| $O_3/O_2$ (sccm) | 2000 | 5000 |
| TEPO (Mg/min) | 30 | 80 |

Still referring to FIG. 3, a graded P content silicon glass layer 26 is formed over the first high P content silicon glass layer 24. The graded P content silicon glass layer 26 preferably has a phosphorous concentration in a range of about 0.1 and 4 weight percent and a thickness in a range of between about 200 and 2000 Å.

Figure 5:
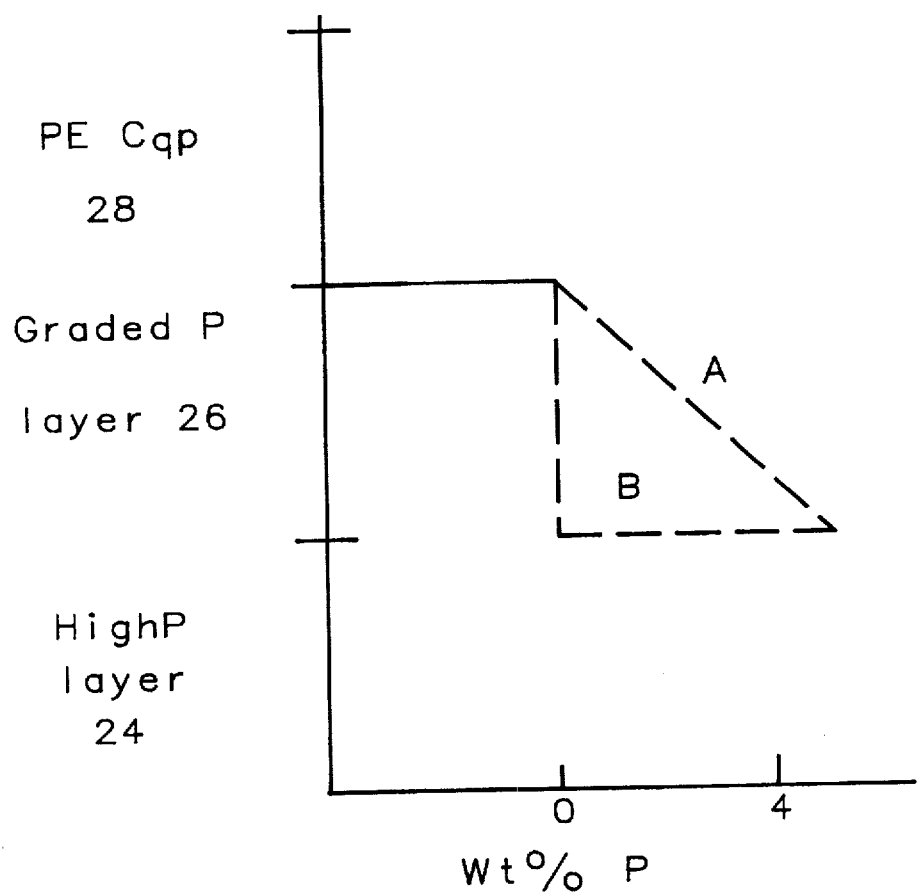
FIG. 5 is a graph showing the P (Phosphorous) concentration in the grade P layer as a function of layer thickness for the present invention.

The graded P content layer 26 can have a P concentration gradient as shown in FIG. 5 in curves A and B (or a concentration profile curve between A and B). More preferably, the graded P content layer 26 has a P concentration profile similar as shown in curve A in FIG. 5. The P content in the graded PSG layer is varied from 0 to 4% by adjusting the triethylphosphate (TEPO) flow rate from 100% to 0%.

A capping layer 28 is formed over the graded P content silicon glass layer 26. The capping layer 28 can be formed of silicon oxide, oxynitride, and nitride, and is more preferably made of silicon oxide. The capping layer 28 composed of silicon oxide is preferably made by a PECVD process using Tetraethylorthosilicate (TEOS).

The capping layer is optionally treated with a $N_2$ or Ar plasma treatment. The silicon oxide layer can be treated with a $N_2$ or Ar plasma treatment which comprises plasma bombardment of the PECVD layer with positive ions, at an energy in a range of about 300 and 700 watts at a frequency of about 13.50 MHz and 13.60 MHz (target 13.56 MHz), or at an energy in a range of about 30 and 400 watts at a frequency of about 300 and 400 KHz (target 350 KHz), for a time in a range of between about 30 and 150 seconds.

Figure 4:
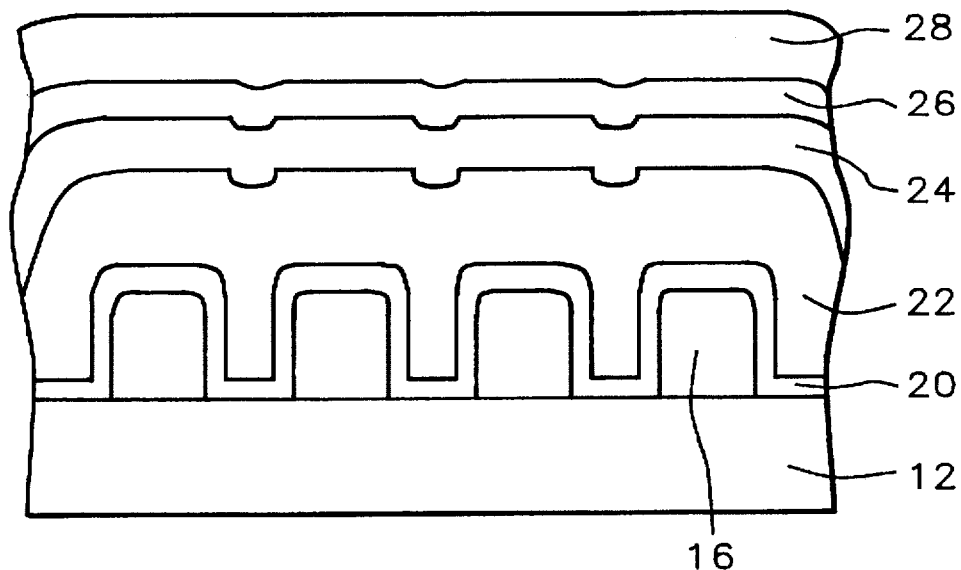

As shown in FIG. 4, the capping layer 28 (e.g., PE cap layer) is preferably planarized using a chemical mechanically polishing process thereby removing a thickness of the capping layer 28 in a range of between about 2000 and 12,000 Å and preferably in a range between about 4000 and 8000 Å, more preferably about 6000 Å.

The capping layer 28 can be chemically mechanically polished (CMP). As shown in FIG. 4, the wafer is subjected to a chemical mechanical polishing technique which is conducted to at least the point of stopping at the upper surface of layer 26. An example slurry would be the SC1 slurry, available from Rodel Products Corporation of Newark, Del. USA. Such slurry comprises KOH, $SiO_2$ particles and water. A typical CMP polish time would be from about 1 to 2 minutes. Any residual slurry left on the wafer surface would be removed by a conventional wet cleaning technique.

The total thickness of the barrier layer 20, the first insulation layer, the high P content silicon glass layer 24, the graded P content silicon glass layer 26 and the capping layer 28 is in a range of about 8000 and 22,000 Å. (tgt=20,000 Å)

The second embodiment of the invention forms an interlayer dielectric layer 20 24 26 28 over a conductive pattern, such as gate electrodes, on a substrate surface. See FIGS. 1 and 2. A major difference between the first and second embodiments is that the second embodiment does not have a first insulating layer 22. [Compare FIG. 3 (1st embodiment) with FIG. 1 (2nd embodiment)].

Figure 1:
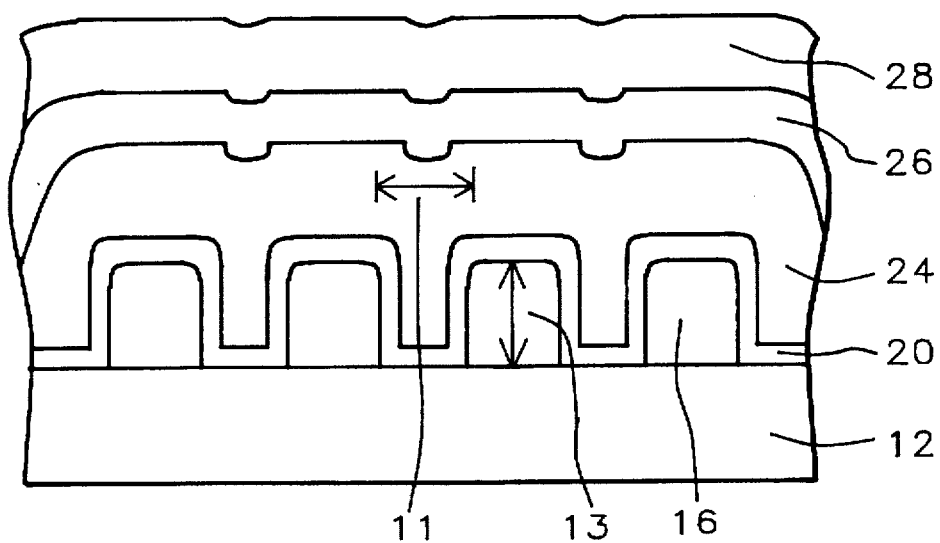
FIGS. 1 and 2 are cross sectional views for illustrating a second embodiment of the method for manufacturing an interlevel/intermetal dielectric layer according to the present invention.
Figure 2:
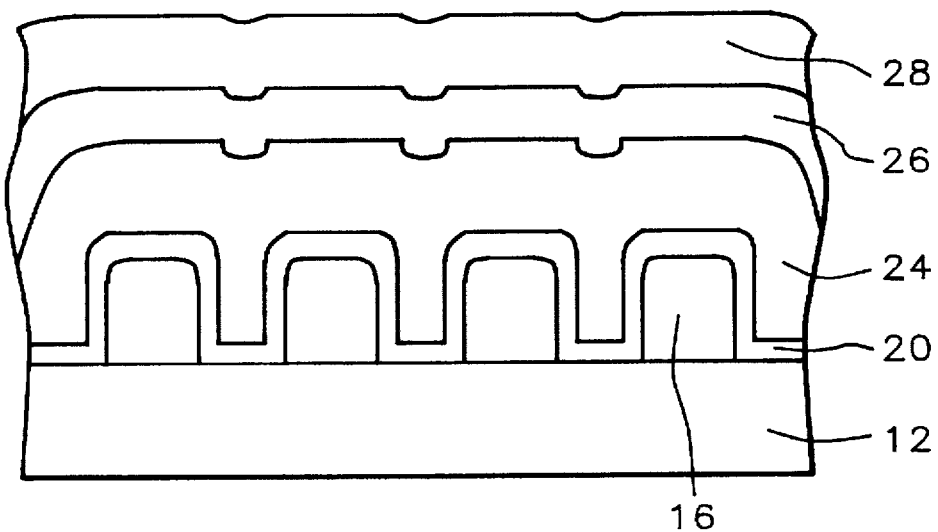

The second embodiment for forming the intermetal layer 20 24 26 of a semiconductor devices begins by providing an semiconductor structure as shown in FIG. 1. A stepped pattern 16 is formed on the semiconductor structure 12. The stepped pattern has gaps therebetween. The stepped pattern preferably represents conductive patterns formed directly on the substrate, such as gate electrodes (and can represent metal lines formed over the substrate). The conductive lines 16 preferably have a height 13 in a range of about 5000 and 10,000 Å and a spacing/gap 11 in a range of between about 0.5 and 1.0 µm.

Next a barrier layer 20 is formed over the stepped pattern 16 as described above in the 1st embodiment. It is important to note that in the next step, the high P content silicon glass (hi PSG) layer 24 is formed directly on the barrier layer. Note that the first insulating layer 22 of the first embodiment is not formed in the second embodiment. Next, the high P content silicon glass layer 24 is formed as described above. The second embodiment (without the first insulating layer 22) is designed for wider interlayer or intermetal spacing compared to the first embodiment.

From this point on, the second embodiment follows the steps of the first embodiment as described above. That is, the method continues by forming a graded p silicon glass layer 26 and a capping layer 18, an optional chemical-mechanical polish step.

The present invention provides intermetal/inter dielectric layers which form voidless fill of narrow trenches between metal conductors, provide a planar surface, reduce stress between different layers, have good moisture resistance, have low dielectric constant, have good ion gettering properties, are compatible with chemical-mechanical polish processes and improve the reliability of the semiconductor devices.

An important feature of the invention is the graded P layer 26 which reduces the stress between the high P layer 24 and the capping layer 28. In addition, the graded P layer 26 provides a more chemical-mechanical polish (CMP) compatible process by acting as a moisture barrier and repelling moisture from the CMP slurry. The graded P layer forms a good moisture barrier which prevents the moisture from the CMP slurry from diffusing to the high P layer 24 which will readily absorb the moisture. This lower the overall moisture content of the dielectric layer which increases reliability.

While the invention has been particularly shown and described with reference to the preferred embodiments thereof, it will be understood by those skilled in the art that various changes in form and details may be made without departing from the spirit and scope of the invention.

What is claimed is:

1. A method of manufacturing a semiconductor device, comprising the steps of:
   a) forming a stepped pattern on a semiconductor structure, said stepped pattern having gaps therebetween;
   b) forming a barrier layer on said semiconductor structure and covering the surface of said stepped pattern;
   c) forming a first insulating layer composed of silicon oxide over said barrier layer;
   d) forming a high phosphorous content silicon glass layer over said first insulating layer; said high phosphorous content silicon glass layer having a phosphorous content between 4 and 10 weight %;
   e) forming an graded P content silicon glass layer over said first high P content silicon glass layer; said graded P content silicon glass layer having a top and a bottom; said bottom adjacent to said high phosphorous content silicon glass layer; said P concentration decreasing throughout the thickness of said graded P content silicon glass layer from said bottom to said top; said graded P content silicon glass layer formed by adjusting a gas flow of a P containing gas during the formation of said graded P content silicon glass layer; and
   f) forming a capping layer composed of a silicon oxide on said graded P content silicon glass layer.

2. The method of claim 1 which further includes treating said capping layer with a plasma treatment; said plasma treatment using a gas of a material selected from the group consisting of: Nitrogen and argon.

3. The method of claim 1 which further includes treating said capping layer with a plasma treatment; said plasma treatment using a gas of a material selected from the group consisting of: Nitrogen and argon; and
   planarizing said capping layer using a chemical mechanically polishing process thereby removing a thickness of said capping layer in a range of between about 2000 and 12,000 Å.

4. The method of claim 1 which further includes treating said capping layer with a plasma treatment; said plasma treatment using a gas of a material selected from the group consisting of nitrogen and argon; and
   planarizing said capping layer using a chemical mechanically polishing process thereby removing a thickness of said capping layer in a range of between about 2000 and 11,000 Å resulting in the total thickness of said barrier layer, said first insulation layer, said high P content silicon glass layer, said graded P content silicon glass layer and said capping layer is in a range of about 8000 and 22,000 Å.

5. The method of claim 1 wherein said step pattern has a height above said semiconductor structure in a range of about 5000 and 10,000 Å and said gaps have a width between said step pattern in a range of about 0.3 and 0.8 μm.

6. The method of claim 1 wherein said barrier layer is composed of a material selected from the group consisting of silicon oxide, silicon nitride, and oxynitride, having a thickness in a range of between about 500 and 2000 Å.

7. The method of claim 1 wherein said first insulating layer is composed of silicon oxide, and said first insulating layer having a thickness in a range of between about 4000 and 10,000 Å.

8. The method of claim 1 wherein said high P content silicon glass layer has a thickness in a range of between about 3000 and 7000 Å.

9. The method of claim 1 wherein said graded P content silicon glass layer has a phosphorous concentration in a range of about 0.1 and 4 weight percent and a thickness in a range of between about 200 and 2000 Å.

10. The method of claim 1 wherein said capping layer is made by a process selected from the group consisting of an ozone -TEOS and PECVD.

11. The method of claim 1 wherein said graded P content silicon glass layer has a P concentration of 0.1 wt % near said top and a P concentration of about 4% near said bottom.

12. The method of claim 1 wherein said graded P content silicon glass layer has a P concentration of 0.1 wt % near said top and a P concentration of about 4% near said bottom; said P concentration decreases linearly throughout said graded P content silicon glass layer from said bottom to said top.

13. The method of claim 1 wherein said graded P content silicon glass layer has a P concentration of 0.1 wt % at said top and a P concentration of about 4% at said bottom; said P concentration decreases linearly throughout said graded P content silicon glass layer from said bottom to said top; and said P containing gas comprises TEPO.

14. A method of manufacturing a semiconductor device, comprising the steps of:
   a) forming a stepped pattern on a semiconductor structure, said stepped pattern having gaps therebetween;
   b) forming a barrier layer composed of silicon oxide on said semiconductor structure and coveting the surface of said stepped pattern; said barrier layer having a thickness in a range of between about 500 and 2000 Å, said barrier layer formed by a process selected from the group consisting of: plasma enhanced chemical vapor deposition, LPCVD, and ozone - TEOS;
   c) forming a first insulating layer composed of silicon oxide over said barrier layer, and said first, insulating layer having a thickness in a range of between about 3000 and 8000 Å;
   d) forming a high phosphorous content silicon glass layer over said first insulating layer, said high P content silicon glass layer having a phosphorous concentration in a range of about 4 and 10 weight percent, a thickness in a range of between about 3000 and 7000 Å;
   e) forming a graded P content silicon glass layer over said first high P content silicon glass layer, said graded P content silicon glass layer having a phosphorous concentration in a range of about 0.1 and 4 weight percent and a thickness in a range of between about 200 and 2000 Å.
   f) forming a capping layer composed of first silicon oxide over said graded P content silicon glass layer,
   g) treating said capping layer with a plasma treatment;
   h) planarizing said capping layer using a chemical mechanically polishing process thereby removing a thickness of said capping layer in a range of between about 4000 and 12,000 Å.

15. The method of claim 14 wherein said step pattern has a height above said semiconductor structure in a range of about 5000 and 10,000 Å and said gaps have a width between said step pattern in a range of about 0.3 and 0.8 µm.

16. The method of claim 14 wherein after step (h) the total thickness of said barrier layer, said first insulation layer, said high P content silicon glass layer, said graded P content silicon glass layer and said capping layer is in a range of about 4000 and 12,000 Å.

17. A method of manufacturing a semiconductor device, comprising the steps of:

a) forming a stepped pattern on a semiconductor structure; said stepped pattern having gaps therebetween;

b) forming a barrier layer composed of silicon oxide over said semiconductor structure and said stepped pattern; said barrier layer having a thickness in a range of between about 500 and 2000 Å; said barrier layer formed by a process selected from the group consisting of: PECVD, LPCVD and ozone-TEOS;

c) forming a high phosphorous content silicon glass layer over said barrier layer, said high P content silicon glass layer having a phosphorous concentration in a range of about 4 and 10 weight percent; a thickness in a range of between about 3000 and 7000 Å;

d) forming a graded P content silicon glass layer over said high P (phosphorous) content silicon glass layer, said graded P content silicon glass layer having a phosphorous concentration in a range of about 0.1 and 4 weight percent and a thickness in a range of between about 200 and 2000 Å;

e) forming a capping layer composed of silicon oxide over said graded P content silicon glass layer; said capping layer formed by PE-TEOS process, of said capping layer having a thickness in a range of between about 4000 and 12,000 Å;

f) treating said first silicon oxide layer with a plasma treatment;

g) planarizing said capping layer using a chemical mechanically polishing process thereby removing a thickness of said capping layer in a range of between about 2000 and 8000 Å.

18. The method of claim 17 wherein said step pattern has a height above said semiconductor structure in a range of about 5000 and 10,000 Å and said gaps have a width between said step pattern in a range of about 0.5 and 1.0 µm.

19. The method of claim 17 wherein after step (g) the total thickness of said barrier layer, said high P content silicon glass layer, said graded P content silicon glass layer and said second silicon oxide layer is in a range of between about 8000 and 22,000 Å.

20. An interlayer insulating layer for a semiconductor device, comprising:

a) a stepped pattern on a semiconductor structure, said stepped pattern having gaps therebetween;

b) a barrier layer on said semiconductor structure covering the surface of said stepped pattern;

c) a first insulating layer composed of silicon oxide over said barrier layer;

d) a high phosphorous content silicon glass layer over said first insulating layer; said high phosphorous content silicon glass layer having a phosphorous content between 4 and 10 weight %;

e) a graded P content silicon glass layer over said first high P content silicon glass layer; said graded P content silicon glass layer having a top and a bottom; said bottom adjacent to said high phosphorous content silicon glass layer; said P concentration decreasing throughout the thickness of said graded P content silicon glass layer from said bottom to said top; and f) a capping layer composed of first silicon oxide over said graded P content silicon glass layer.

21. The interlayer insulating layer of claim 20 wherein said capping layer has a thickness in a range of between about 2000 and 11,000 Å, the total thickness of said barrier layer, said first insulation layer, said high P content silicon glass layer, said graded P content silicon glass layer and said capping layer is in a range of about between 8000 and 22,000 Å.

22. The interlayer insulating layer of claim 20 wherein said step pattern has a height above said semiconductor structure in a range of about 5000 and 10,000 Å and said gaps have a width between said step pattern in a range of between about 0.3 and 0.8 µm.

23. The interlayer insulating layer of claim 20 wherein said barrier layer is composed of a material selected from the group consisting of silicon oxide, silicon nitride, and oxynitride, having a thickness in a range of between about 500 and 2000 Å.

24. The interlayer insulating layer of claim 20 wherein said first insulating layer is composed of silicon oxide, and said first insulating layer has a thickness in a range of between about 4000 and 10,000 Å.

25. The interlayer insulating layer of claim 20 wherein said high P content silicon glass layer having a thickness in a range of between about 3000 and 7000 Å.

26. The interlayer insulating layer of claim 20 wherein said graded P content silicon glass layer has a phosphorous concentration in a range of about 0.1 and 4 weight percent and a thickness in a range of between about 200 and 2000 Å.

27. The interlayer insulating layer of claim 20 wherein said graded P content silicon glass layer has a P concentration of 0.1 wt % near said top and a P concentration of about 4% near said bottom; and said P concentration decreasing throughout the thickness of said graded P content silicon glass layer from said bottom to said top.

28. The interlayer insulating layer of claim 20 wherein said graded P content silicon glass layer has a P concentration of 0.1 wt % near said top and a P concentration of about 4% near said bottom; said P concentration decreases linearly throughout said graded P content silicon glass layer from said bottom to said top.

29. An interlayer insulating layer for a semiconductor device, comprising:

a) a stepped pattern on a semiconductor structure, said stepped pattern having gaps therebetween;

b) a barrier layer on said semiconductor structure coveting the surface of said stepped pattern;

c) a high phosphorous content silicon glass layer over said barrier layer; said high phosphorous content silicon glass layer having a phosphorous content between 4 and 10 weight %;

d) a graded P content silicon glass layer over said first high P content silicon glass layer; said graded P content silicon glass layer having a top and a bottom; said bottom adjacent to said high phosphorous content silicon glass layer; said P concentration decreasing throughout the thickness of said graded P content silicon glass layer from said bottom to said top; and e) a capping layer composed of first silicon oxide over said graded P content silicon glass layer.

30. The interlayer insulating layer of claim 29 wherein said step pattern has a height above said semiconductor structure in a range of about 5000 and 10,000 Å and said gaps have a width between said step pattern in a range of between about 0.5 and 1.0 μm, and said stepped pattern is a gate electrode.

31. The interlayer insulating layer of claim 29 wherein said barrier layer is composed of a material selected from the group consisting of silicon oxide, silicon nitride, and oxynitride, having a thickness in a range of between about 500 and 2000 Å.

32. The interlayer insulating layer of claim 29 wherein said high V content silicon glass layer has a thickness in a range of between about 3000 and 7000 Å.

33. The interlayer insulating layer of claim 29 wherein said graded P content silicon glass layer has a phosphorous concentration in a range of about 0.1 and 4 weight percent and a thickness in a range of between about 200 and 2000 Å.

34. The interlayer insulating layer of claim 29 wherein said graded P content silicon glass layer has a P concentration of 0.1 wt % near said top and a P concentration of about 4% near said bottom; and said P concentration decreasing throughout the thickness of said graded P content silicon glass layer from said bottom to said top.

35. The interlayer insulating layer of claim 29 wherein said graded P content silicon glass layer has a P concentration of 0.1 wt % at said top and a P concentration of about 4% at said bottom; said P concentration decreases linearly throughout said graded P content silicon glass layer from said bottom to said top.

36. A method of manufacturing a semiconductor device, comprising the steps of:

a) forming a stepped pattern on a semiconductor structure, said stepped pattern having gaps therebetween;

b) forming a barrier layer on said semiconductor structure and covering the surface of said stepped pattern;

c) forming a first insulating layer composed of silicon oxide over said barrier layer;

d) forming a high phosphorous content silicon glass layer over said first insulating layer; said high phosphorous content silicon glass layer having a phosphorous content between 4 and 10 weight %;

e) forming a graded P content silicon glass layer over said first high P content silicon glass layer; and f) forming a capping layer composed of a silicon oxide over said graded P content silicon glass layer; treating said capping layer with a plasma treatment; said plasma treatment using a gas of a material selected from the group consisting of: Nitrogen and argon; and h) planarizing said capping layer using a chemical mechanically polishing process thereby removing a thickness of said capping layer in a range of between about 2000 and 12,000 Å.

37. The method of claim 36 which further includes: the total thickness of said barrier layer, said first insulation layer, said high P content silicon glass layer, said graded P content silicon glass layer and said capping layer is in a range of about 8000 and 22,000 Å.

* * * * *